United States Patent
Kim et al.

(10) Patent No.: US 11,017,853 B2
(45) Date of Patent: May 25, 2021

(54) CROSS POINT RESISTIVE MEMORY DEVICE WITH COMPENSATION FOR LEAKAGE CURRENT IN READ OPERATION

(71) Applicant: SAMSUNG ELECTRONICS CO., LTD., Suwon-si (KR)

(72) Inventors: Jong-Ryul Kim, Dangjin-si (KR); Moo-Sung Kim, Hwaseong-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 16/691,173

(22) Filed: Nov. 21, 2019

(65) Prior Publication Data
US 2020/0168273 A1 May 28, 2020

(30) Foreign Application Priority Data
Nov. 26, 2018 (KR) .................. 10-2018-0147685

(51) Int. Cl.
 *G11C 13/00* (2006.01)
(52) U.S. Cl.
 CPC ........ *G11C 13/004* (2013.01); *G11C 13/0004* (2013.01); *G11C 13/0026* (2013.01); *G11C 13/0028* (2013.01); *G11C 13/0069* (2013.01); *G11C 2013/0045* (2013.01); *G11C 2013/0078* (2013.01); *G11C 2213/15* (2013.01); *G11C 2213/32* (2013.01); *G11C 2213/52* (2013.01); *G11C 2213/72* (2013.01)

(58) Field of Classification Search
None
See application file for complete search history.

(56) References Cited

U.S. PATENT DOCUMENTS

| 5,991,193 | A | * | 11/1999 | Gallagher | G11C 11/15 365/171 |
| 6,130,835 | A | * | 10/2000 | Scheuerlein | G11C 11/15 365/158 |
| 6,940,742 | B2 | * | 9/2005 | Yamamura | G11C 11/22 365/145 |
| 7,382,647 | B1 | * | 6/2008 | Gopalakrishnan | G11C 13/0007 365/100 |
| 7,646,629 | B2 | * | 1/2010 | Hamberg | G06F 12/0238 365/158 |
| 7,672,175 | B2 | | 3/2010 | Yoon et al. | |

(Continued)

*Primary Examiner* — J. H. Hur
(74) *Attorney, Agent, or Firm* — Volentine, Whitt & Francos, PLLC

(57) ABSTRACT

A memory device and an operating method of the memory device, the memory device including a memory cell array including a plurality of memory cells respectively arranged at points at which a plurality of word lines and a plurality of bit lines cross; and a control logic circuit configured to precharge a selected word line connected to a selected memory cell and precharge a selected bit line connected to the selected memory cell in a read operation, wherein the control logic circuit is further configured to precharge a first unselected word line among unselected word lines to a second voltage when the selected word line is precharged to a first voltage, a level of the first voltage is lower than a level of a third voltage applied to an unselected bit line when the selected word line is precharged to the first voltage, and a level of the second voltage is higher than the level of the third voltage.

16 Claims, 16 Drawing Sheets

(56) References Cited

U.S. PATENT DOCUMENTS

| | | | |
|---|---|---|---|
| 8,279,704 B2* | 10/2012 | Scheuerlein | G11C 8/14 365/230.06 |
| 9,042,190 B2 | 5/2015 | Vimercati et al. | |
| 9,263,126 B1* | 2/2016 | Viviani | G11C 13/0061 |
| 9,275,746 B2 | 3/2016 | Jeon et al. | |
| 9,455,032 B2 | 9/2016 | Kang | |
| 9,721,652 B2 | 8/2017 | Puthenthermadam et al. | |
| 9,934,853 B2 | 4/2018 | Yang et al. | |
| 2004/0004856 A1* | 1/2004 | Sakimura | G11C 11/15 365/158 |
| 2004/0113137 A1* | 6/2004 | Lowrey | H01L 27/2427 257/5 |
| 2006/0256612 A1* | 11/2006 | Cho | G11C 13/0028 365/163 |
| 2008/0112209 A1* | 5/2008 | Cho | G11C 13/0004 365/148 |
| 2009/0213639 A1* | 8/2009 | Toda | G11C 29/50 365/148 |
| 2010/0178729 A1* | 7/2010 | Yoon | H01L 27/249 438/104 |

* cited by examiner

CROSS POINT RESISTIVE MEMORY DEVICE WITH COMPENSATION FOR LEAKAGE CURRENT IN READ OPERATION

CROSS-REFERENCE TO RELATED APPLICATION

This application claims the benefit of Korean Patent Application No. 10-2018-0147685, filed on Nov. 26, 2018, in the Korean Intellectual Property Office, the disclosure of which is incorporated herein in its entirety by reference.

BACKGROUND

The inventive concept relates to a memory device, and more particularly, to a resistive memory device which is configured for compensating for a leakage current in a read operation mode, and an operating method of the resistive memory device which may compensate for a leakage current in a read operation mode.

As nonvolatile memory devices, resistive memories such as phase change random access memory (PRAM), resistive RAM (RRAM), and magnetic RAM (MRAM) are known. The resistive memories use, as a memory cell, a variable resistance element which is configured to store data based on a change in a resistance state. A common feature of materials forming the resistive memories is that a resistance value of the materials varies according to a magnitude and/or a direction of a current or a voltage, and the materials have a nonvolatile characteristic that a resistance value of the materials is maintained as it is, even though the current or the voltage is cut off.

One of the objectives for improving the performance of a memory device is to improve the reliability of a read operation of the memory device by improving the performance of the read operation. There is demand for various methods of improving the performance of a read operation of a memory device.

SUMMARY

The inventive concept provides a memory device, and more particularly, a memory device capable of improving the reliability of a read operation by decreasing a read error, and an operating method of such a memory device.

According to an aspect of the inventive concept, there is provided a memory device including: a memory cell array including a plurality of memory cells respectively arranged at points at which word lines cross bit lines; and a control logic circuit configured to precharge a selected word line connected to a selected memory cell and to precharge a selected bit line connected to the selected memory cell in a read operation, wherein the control logic circuit is further configured to precharge a first unselected word line among a plurality of unselected word lines to a second voltage when the selected word line is precharged to a first voltage, and wherein a level of the first voltage is lower than a level of a third voltage applied to an unselected bit line when the selected word line is precharged to the first voltage, and a level of the second voltage is higher than the level of the third voltage.

According to another aspect of the inventive concept, there is provided a memory device including: a memory cell array including a plurality of memory cells respectively arranged at points at which word lines cross bit lines; and a control logic circuit configured to control a voltage to be provided to the plurality of word lines, wherein the control logic circuit is further configured to provide a second voltage to one or more first unselected word lines among a plurality of unselected word lines when a first voltage is provided to a selected word line connected to a selected memory cell among the plurality of memory cells, and to float the one or more first unselected word lines when the selected word line is floated, and wherein a level of the first voltage is lower than a level of a third voltage provided to an unselected bit line when the first voltage is provided to selected word line, and a level of the second voltage is higher than the level of the third voltage.

According to yet another aspect of the inventive concept, there is provided an operating method of a memory device including a plurality of memory cells respectively arranged at regions at which word lines cross bit lines, the operating method including: precharging, to a first voltage, a selected word line connected to a selected memory cell among the plurality of memory cells; precharging, to a second voltage, one or more first unselected word lines among a plurality of unselected word lines; floating the selected word line from the first voltage; and floating the one or more first unselected word lines from the second voltage, wherein the precharging of the selected word line and the precharging of the one or more first unselected word lines are performed in parallel to each other, and wherein a level of the first voltage is lower than a level of a third voltage applied to an unselected bit line when the selected word line is precharged to the first voltage, and a level of the second voltage is higher than the level of the third voltage.

According to still another aspect of the inventive concept, a memory device comprises: a memory cell array comprising a plurality of word lines, a plurality of bit lines, and a plurality of memory cells each connected to one of the word lines and one of the bit lines; and a control logic circuit, wherein the control logic circuit is configured to control a data read operation for reading data from a selected memory cell which is connected to a selected bit line among the plurality of bit lines and is further connected to a selected word line among the plurality of word lines, wherein the word lines further include a plurality of unselected word lines which are not connected to the selected memory cell, wherein the control logic circuit is configured to precharge the selected word line to a first voltage, and to precharge the selected bit line, in the data read operation, wherein the control logic circuit is configured provide a second voltage to one or more first unselected word lines among the plurality of unselected word lines when the first voltage is provided to the selected word line, and wherein a level of the first voltage is lower than a level of a third voltage provided to an unselected bit line when the first voltage is provided to the selected word line, and a level of the second voltage is higher than the level of the third voltage.

BRIEF DESCRIPTION OF THE DRAWINGS

Embodiments of the inventive concept will be more clearly understood from the following detailed description taken in conjunction with the accompanying drawings.

DETAILED DESCRIPTION OF THE EMBODIMENTS

Hereinafter, embodiments will be described in detail with reference to the accompanying drawings.

Figure 1:
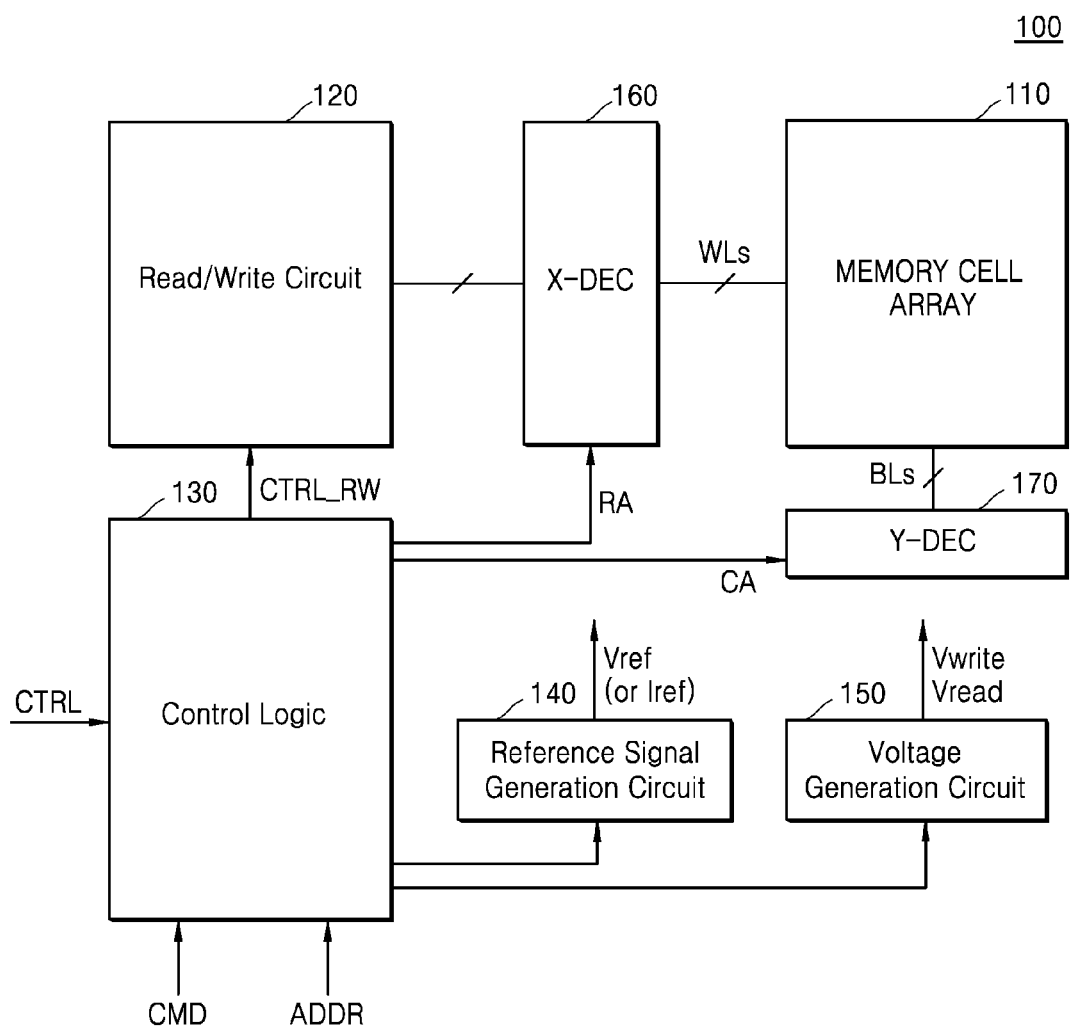
FIG. 1 is a block diagram of an example embodiment of a memory device.
Figure 2:
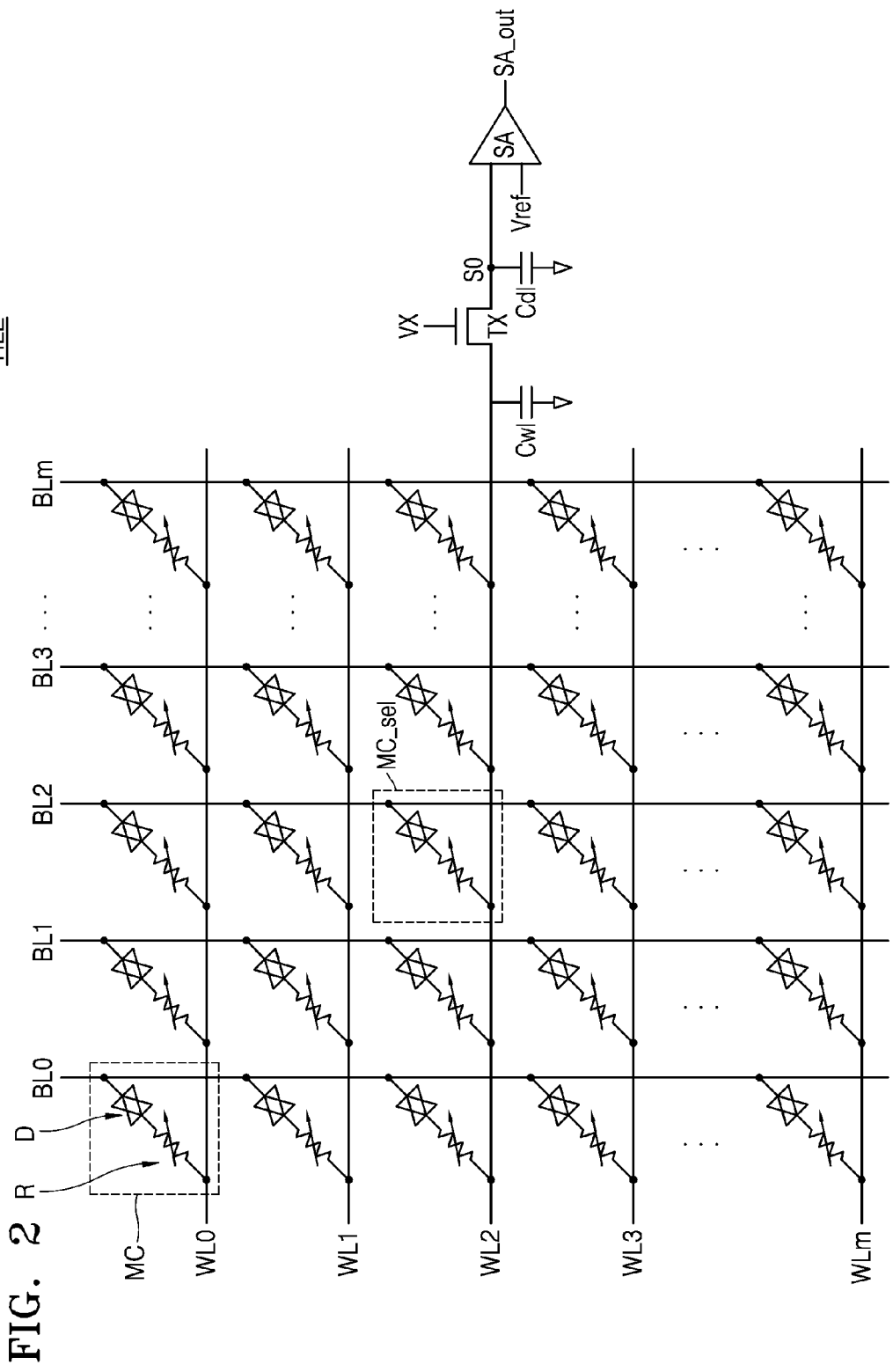
FIG. 2 is a circuit diagram of a portion of an example embodiment of a memory cell array of FIG. 1.

FIG. 1 is a block diagram of an example embodiment of a memory device 100. FIG. 2 is a circuit diagram of a portion of an example embodiment of a memory cell array 110 of FIG. 1. Although FIG. 2 shows only a sense amplifier SA connected to a third word line WL2, a sense amplifier may be connected to each of the word lines beside the third word line WL2.

Referring to FIGS. 1 and 2, memory device 100 may include memory cell array 110, a read/write circuit 120, a control logic circuit 130, a reference signal generation circuit 140, a voltage generation circuit 150, a row decoder (X-DEC) 160, and a column decoder (Y-DEC) 170. Here, control logic circuit 130 may be implemented by discrete logic elements, by an application specific integrated circuit (ASIC), by a combination of a memory that stores instructions and a processor that executes the instructions, or by any combination of these devices.

Memory cell array 110 may include a plurality of memory cells, and the plurality of memory cells may be connected to a plurality of first signal lines and a plurality of second signal lines, respectively. In some embodiments, the plurality of first signal lines may be word lines WLs, and the plurality of second signal lines may be bit lines BLs. Alternatively, in some embodiments, the plurality of first signal lines may be bit lines BLs, and the plurality of second signal lines may be word lines WLs. Upon providing various voltage signals or current signals through the plurality of word lines WLs and bit lines BLs, data may be written in, or read from, selected memory cells, and a write operation or a read operation may be prevented from being performed on the remaining unselected memory cells.

In some embodiments, memory cell array 110 may include a plurality of layers each including memory cells and stacked vertically. For example, the memory cell array 110 may have a multi-deck structure. Adjacent layers among the plurality of layers may share a signal line. For example, the plurality of layers may include a first layer and a second layer, and the first layer and the second layer may share a signal line with each other. However, the present disclosure is not limited thereto, and adjacent layers may not share signal lines with each other.

Memory cell array 110 may include a plurality of memory tiles, and FIG. 2 may illustrate one memory tile TILE. The memory tile TILE may include a first to (m+1)th word lines WL0 to WLm, a first to (m+1)th bit lines BL0 to BLm and a plurality of memory cells MC. Herein, the number of word lines WLs, the number of bit lines BLs, and the number of memory cells MC may be variously modified according to embodiments.

In some embodiments, each of the plurality of memory cells MC may include a variable resistor R and a select element D, wherein the variable resistor R may be referred to as a variable resistance element or a variable resistance material, and the select element D may be referred to as a switching element. The select element D may be implemented using various devices such as a transistor and a diode.

The variable resistance element R may include a phase change film (or a variable resistance layer) including germanium, antimony, and tellurium mixtures (GST, Ge—Sb—Te), and an upper electrode formed on the phase change film and a lower electrode formed under the phase change layer.

The upper and lower electrodes may include various metals, metal oxides or metal nitrides. For example, the upper and lower electrodes may include aluminum (Al), copper (Cu), titanium nitride (TiN), titanium aluminum nitride (TixAlyNz), iridium (Ir), platinum (Pt), silver (Ag), gold (Au), polysilicon (poly silicon), tungsten (W), titanium (Ti), tantalum (Ta), tantalum nitride (TaN), tungsten nitride (WN)), nickel (Ni), cobalt (Co), chromium (Cr), antimony (Sb), iron (Fe), molybdenum (Mo), palladium (Pd). Comment (Sn). Zirconium (Zr), zinc (Zn), iridium oxide (IrO 2), strontium zirconate oxide (StZrO 3), and the like.

The phase change film may include a bipolar resistive memory material or a unipolar resistive memory material. The bipolar resistive memory material may be programmed in a set or reset state by the polarity of the current, and perovskite-based materials may be used for the bipolar resistive memory material. On the other hand, the unipolar resistive memory material may be programmed in a set or reset state even by a current of the same polarity, and a transition metal oxide such as NiOx or TiOx may be used as the unipolar resistive memory material.

The GST materials may be programmed between an amorphous state with a relatively high resistivity and a crystalline state with a relatively low resistivity. The GST material may be programmed by heating the GST material. The magnitude of heating and time of heating may determine whether the GST material remains in an amorphous or crystalline state. The high resistivity and low resistivity may be represented by programmed values logic 0 or logic 1, respectively, and may be sensed by measuring the resistivity of the GST material. In contrast, the high resistivity and low resistivity may be represented by programmed values logic 1 or logic 0, respectively.

The select element D may include a selection element layer as a current adjustment layer capable of controlling the flow of current. The selection element layer may include a material layer whose resistance may vary depending on the magnitude of the voltage across the selection element layer. For example, the selection element layer may include an Ovonic Threshold Switching (OTS) material. When a voltage smaller than the threshold voltage is applied to the selection element layer, the selection element layer may maintain a high resistance state in which almost no current flows. In addition, when a voltage greater than the threshold voltage is applied to the selection element layer, the current may flow in a low resistance state. When the current flowing through the selection element layer becomes smaller than the holding current, the selection element layer may be changed to a high resistance state. In an embodiment, the select device layer may include a chalcogenide switching material as an OTS material.

In some embodiments, the variable resistor R may be connected between one of the first to (m+1)th bit lines BL0 to BLm and the select element D, and the select element D may be connected between the variable resistor R and one of the first to (m+1)th word lines WL0 to WLm. However, embodiments are not limited thereto, and the select element D may be connected between one of the first to (m+1)th bit lines BL0 to BLm and the variable resistor R, and the variable resistor R may be connected between the select element D and one of the first to (m+1)th word lines WL0 to WLm. Although FIG. 2 shows that the number of first to (m+1)th bit lines BL0 to BLm is the same as the number of first to (m+1)th word lines WL0 to WLm forming one memory tile TILE, embodiments are not limited thereto and may be different from the present embodiment. In some embodiments, the memory tile TILE may include 1024 or more bit lines BLs, and the memory tile TILE may include more than twice as many the word lines WLs as the bit lines BLs.

The select element D may be connected between any one of the first to (m+1)th word lines WL0 to WLm and the variable resistor R and may control supply of a current to the variable resistor R according to voltages applied to the connected word line and a bit line. In some embodiments, the select element D may include a bidirectional diode.

In addition, as used herein, a "selected memory cell MC_sel" may indicate a memory cell on which a write, read, and/or delete operation and/or the like are performed among the plurality of memory cells MC. In addition, an "unselected memory cell" may indicate a memory cell other than the selected memory cell MC_sel among the memory cells MC. Also, a "selected word line" (e.g., the third word line WL2) may indicate a word line to which the selected memory cell MC_sel is connected among the first to (m+1)th word lines WL0 to WLm, and a "selected bit line" (e.g., the third bit line BL2) may indicate a bit line to which the selected memory cell MC_sel is connected among the first to (m+1)th bit lines BL0 to BLm. Furthermore, an "unselected word line" may indicate a word line to which the selected memory cell MC_sel is not connected among the plurality of first to (m+1)th word lines WL0 to WLm, and an "unselected bit line" may indicate a bit line to which the selected memory cell MC_sel is not connected among the plurality of first to (m+1)th bit lines BL0 to BLm.

Memory device 100 may receive an address ADDR indicating a memory cell to be accessed, along with a command CMD, and the address ADDR may include a row address RA for selecting among word lines WLs of memory cell array 110 and a column address CA for selecting among bit lines BLs of memory cell array 110.

Row decoder 160 may perform a word line select operation in response to the row address RA provided from control logic circuit 130, and column decoder 170 may perform a bit line select operation in response to the column address CA provided from control logic circuit 130. For example, row decoder 160 may include a select transistor TX for performing the word line select operation and connect the third word line WL2 and a sensing node S0 according to a select signal VX. Parasitic capacitors Cw1 and Cd1 may be formed between the third word line WL2 and the sense amplifier SA.

In some embodiments, row decoder 160 and column decoder 170 may apply a read voltage Vread to the third word line WL2 as the selected word line and a third bit line BL2 as the selected bit line connected to the selected memory cell MC_sel, to perform a read operation on the selected memory cell MC_sel. The read operation will be described below with reference to FIG. 5 and the like. In some embodiments, the read voltage Vread may have a value between 4V and 6V.

Read/write circuit 120 may be connected to the first signal lines and/or the second signal lines of memory cell array 110 to write data in a memory cell or to read data from a memory cell. For example, read/write circuit 120 may write data in a memory cell or read data from a memory cell through the word lines WLs. Read/write circuit 120 may include the sense amplifier SA and a write driver. In some embodiments, the sense amplifier SA and the write driver may be connected to the plurality of word lines.

FIG. 1 shows an embodiment in which read/write circuit 120 is connected to memory cell array 110 through the word lines WLs. However, according to implementations, read/write circuit 120 may be connected to memory cell array 110 through the bit lines BLs. In this case, the same technical idea described herein may be applied thereto, except that signal lines connected to read/write circuit 120 are the bit lines BLs instead of the word lines WLs.

A case where control logic circuit 130 performs an operation of reading data through read/write circuit 120 may indicate that memory device 100 is in a read operation mode. The read operation mode may include a word line precharge period, a bit line precharge period, and a charge share period.

Read/write circuit 120 may include the sense amplifier SA. The sense amplifier SA may output a sense amplifier output value SA_out by amplifying a voltage difference value between a voltage of the third word line WL2 to which the selected memory cell MC_sel is connected and a reference voltage Vref in the read operation mode. In some embodiments, in the charge share period in which charges of the third word line WL2 and the sensing node S0 are shared in the read operation mode, the sense amplifier SA may output the sense amplifier output value SA_out by amplifying a voltage difference value between a voltage of the sensing node S0 after charges are shared, and the reference voltage Vref. In some embodiments, the sense amplifier SA may be enabled state after the selected bit line (e.g., the third bit line BL2) is precharged to a bit line precharge voltage.

Voltage generation circuit 150 may generate a write voltage set Vwrite to be used for a write operation and generate read voltage set Vread to be used for a read operation. In some embodiments, the read voltage set Vread may include a first voltage to be applied to a selected word line, e.g., the third word line WL2, and may include a second voltage to be applied to at least one unselected word line, in the word line precharge period of the read operation mode. Reference signal generation circuit 140 may generate the reference voltage Vref (or a reference current Iref) as various types of reference signals associated with a data read operation.

Control logic circuit 130 may generate various types of internal control signals (e.g., CTRL_RW) for writing data in memory cell array 110 or reading data from memory cell array 110, based on the command CMD, the address ADDR and a control signal CTRL received from the outside (e.g., a memory controller) of memory device 100. Control logic circuit 130 may generally control various types of operations in memory device 100. In some embodiments, a series of control operations performed by memory device 100 may be performed by control logic circuit 130.

Along with an increase in a degree of integration of memory device 100, the number of bit lines crossing one word line has increased. The increase in the number of bit lines may cause an increase in the number of unselected memory cells connected to a selected word line. Therefore, even when a magnitude of a leakage current flowing through each of the unselected memory cells is small, a total magnitude of leakage current occurring due to a plurality of unselected memory cells may increase, thereby increasing a voltage of the selected word line and affecting the reliability of a data operation of memory device 100.

According to an example embodiment, memory device 100 may generate an additional leakage current flowing through each of unselected memory cells connected to at least one unselected word line among a plurality of unselected word lines by applying the second voltage to the at least one unselected word line when the first voltage is applied to a selected word line, in the word line precharge period of the read operation. A coupling effect between the selected word line and the at least one unselected word line may prevent a voltage of the selected word line from increasing due to a leakage current flowing through the selected word line. Memory device 100 may compensate for the leakage current occurring in the selected word line by unselected cells, thereby ensuring a wide read window. Memory device 100 may ensure the wide read window, thereby decreasing the occurrence of a read error and improving the reliability of a read operation.

In some embodiments, memory device 100 may include an integrated circuit layer disposed on a substrate, and a memory cell array 110 may be disposed on the integrated circuit layer. The integrated circuit layer may include a peripheral circuit for the operation of the memory cells and/or a core circuit for the operation of the memory cells. For example, the integrated circuit layer may comprise a read/write circuit 120, a control logic circuit 130, a reference signal generation circuit 140, a voltage generation circuit 150. That is, memory device 100 may have a COP (Cell On Peri) structure.

Figure 3A:
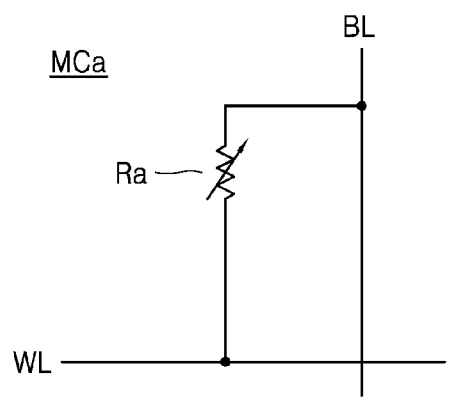
FIGS. 3A and 3B are circuit diagrams of modified examples of a memory cell of FIG. 2.
Figure 3B:
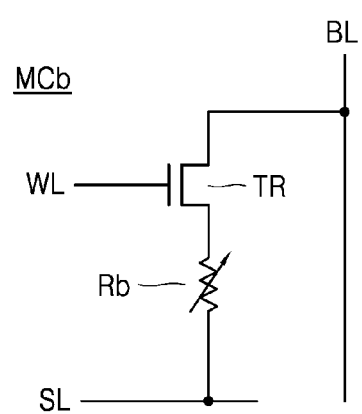

FIGS. 3A and 3B are circuit diagrams of modified examples of a memory cell of FIG. 2.

Referring to FIG. 3A, a memory cell MCa may include a variable resistor Ra, and the variable resistor Ra may be connected between a bit line BL and a word line WL. The memory cell MCa may store data by voltages respectively applied to the bit line BL and the word line WL.

Referring to FIG. 3B, a memory cell MCb may include a variable resistor Rb and a transistor TR. The transistor TR may be a select element, i.e., a switching element, configured to supply or cut off a current to the variable resistor Rb according to a voltage of the word line WL. In the embodiment of FIG. 3B, a source line SL for adjusting a voltage level across both ends of the variable resistor Rb may be additionally provided besides the word line WL. The transistor TR may be connected between the variable resistor Rb and the bit line BL, and the variable resistor Rb may be connected between the source line SL and the transistor TR. Locations of the transistor TR and the variable resistor Rb may be exchanged. The memory cell MCb may be selected or unselected according to whether the transistor TR driven by the word line WL is on or off.

Figure 4:
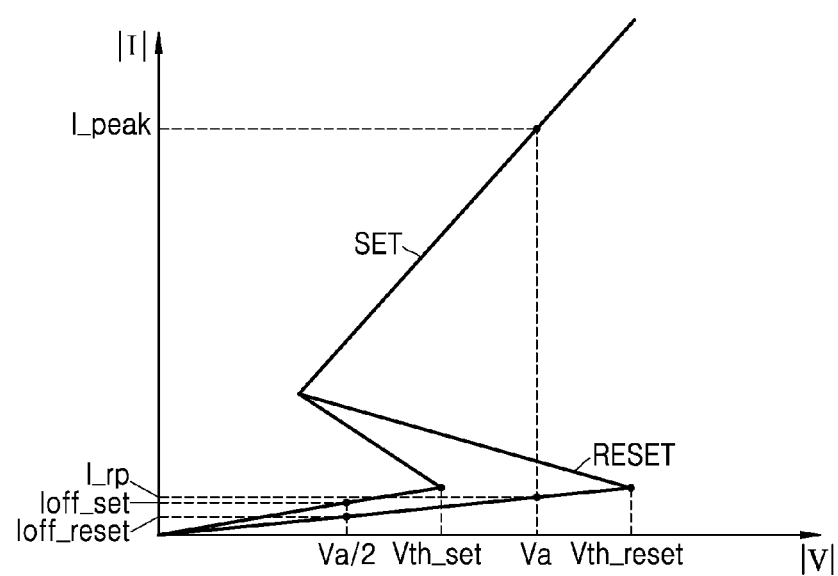
FIG. 4 is an example current-voltage characteristic graph of an example embodiment of a resistive memory cell, and a graph of a current flowing through a memory cell in a crystalline state.

FIG. 4 is an example of a current-voltage characteristic graph of an example embodiment of a resistive memory cell, and a graph of a current flowing through a memory cell in a crystalline state. The crystalline state in which a resistance of the resistive memory cell is low may be referred to as a SET state, and an amorphous state in which the resistance of the resistive memory cell is high may be referred to as a RESET state.

Referring to the current-voltage characteristic graph of the resistive memory cell illustrated in FIG. 4, the memory cell may exhibit different current-voltage characteristics in the SET state than in the RESET state. A memory device may read data in a selected memory cell by using a difference between the current-voltage characteristics in the SET state and the RESET state, in the read operation mode. For example, the memory device may identify a memory cell in the SET state and a memory cell in the RESET state by applying a read voltage Va, having a value between a threshold voltage Vth_set of a SET state curve and a threshold voltage Vth_reset of a RESET state curve, across both ends of the selected memory cell.

Referring to FIGS. 2 and 4, when the selected memory cell MC_sel is in the RESET state, memory device 100 may apply the read voltage Va across both ends of the selected memory cell MC_sel to read data. For example, memory device 100 may apply the read voltage Va across the both ends of the selected memory cell MC_sel by precharging the selected word line (e.g., the third word line WL2) to the first voltage (e.g., −Va/2) that is a precharge voltage, and precharging the selected bit line BL2 to a bit line precharge voltage (e.g., Va/2). Referring to the RESET state curve in the current-voltage characteristic graph of FIG. 4, when the read voltage Va is applied across both ends of the selected memory cell MC_sel in the RESET state, a current corresponding to a reset peak current I_rp may flow through the selected memory cell MC_sel. When compared with a peak current I_peak, the reset peak current I_rp may be so small as to be negligible.

Otherwise, when the selected memory cell MC_sel is in the SET state, memory device 100 may apply the read voltage Va across both ends of the selected memory cell MC_sel to read data. Referring to the SET state curve in the current-voltage characteristic graph, when the read voltage Va is applied across both ends of the selected memory cell MC_sel in the SET state, a current corresponding to the peak current I_peak may instantaneously flow through the selected memory cell MC_sel.

Because memory device 100 precharges the selected word line WL2 to the first voltage (e.g., −Va/2), that is the precharge voltage to read data, the first voltage may also be applied to unselected memory cells connected to the selected word line WL2. Accordingly, a first leakage current Ioff_set or Ioff_reset may occur in the unselected memory cells connected to the select word line WL2. In this case, a magnitude of a reset leakage current Ioff_reset when each of the unselected memory cells connected to the selected word line WL2 is in the RESET state may be less than a magnitude of a set leakage current Ioff_set when each of the unselected memory cells connected to the selected word line WL2 is in the SET state.

Figure 5:
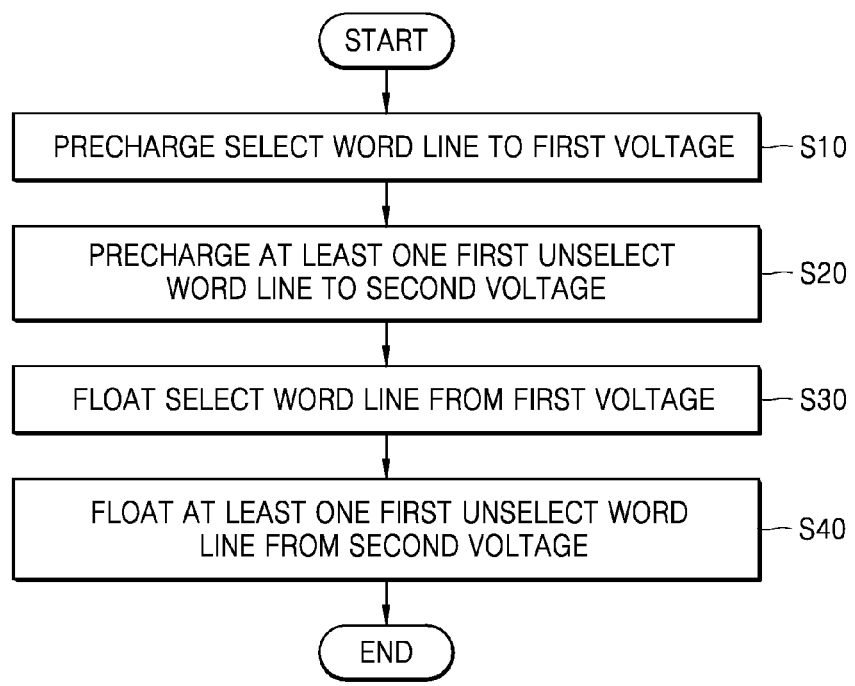
FIG. 5 is a flowchart for describing an example embodiment of a read operation mode of a memory device.

FIG. 5 is a flowchart for describing an example embodiment of the read operation mode of a memory device.

Referring to FIGS. 1 and 5, control logic circuit 130 of memory device 100 may perform a word line precharge operation in the read operation mode to perform a read operation. In operation S10, control logic circuit 130 may apply the first voltage to a selected word line (e.g., WL2 of FIG. 2) connected to a selected memory cell (e.g., MC_sel of FIG. 2). In some embodiments, the first voltage may be a negative voltage and may have a half of a magnitude of the read voltage Vread (e.g., Va in FIG. 4).

In operation S20, control logic circuit 130 may apply the second voltage to at least one first unselected word line among unselected word lines. Operation S20 may be performed in parallel to operation S10.

In some embodiments, the at least one first unselect word line may include a word line adjacent to the selected word line. For example, the at least one first unselected word line may be a second word line WL1 of FIG. 2. In some embodiments, the at least one first unselected word line may include a word line which is not adjacent to the selected word line. In some embodiments, a level of the first voltage may be lower than a level of a third voltage applied to an unselected bit line when the selected word line is precharged to the first voltage, and a level of the second voltage may be higher than the level of the third voltage. In some embodiments, the second voltage may be a positive voltage and may have substantially the same magnitude as the first voltage. For example the second voltage may have a half value of that of the read voltage Vread (e.g., Va in FIG. 4).

In some embodiments, a magnitude of the second voltage may be variable. In some embodiments, the magnitude of the second voltage may be determined according to a program state of memory cells connected to the at least one first unselected word line. For example, control logic circuit 130 may determine the magnitude of the second voltage such that the magnitude of the second voltage to be provided to a first unselected word line is larger as the number of memory cells in the RESET state among memory cells connected to the first unselected word line is larger.

In some embodiments, the magnitude of the second voltage to be provided to the first unselected word line may be determined according to a program state of memory cells connected to the selected word line. For example, control logic circuit 130 may determine the magnitude of the second voltage such that the magnitude of the second voltage to be provided to the first unselected word line is smaller as the number of unselected memory cells in the RESET state among unselected memory cells connected to the selected word line is larger. A description of an embodiment in which control logic circuit 130 determines the magnitude of the second voltage will be made below with reference to FIGS. 10A, 10B, 11, 12A, and 12B.

In operation S30, control logic circuit 130 may float the selected word line from the first voltage. In operation S40, control logic circuit 130 may float the at least one first unselected word line from the second voltage. Operation S30 may be performed in parallel to operation S40. In some embodiments, control logic circuit 130 may start operations S30 and S40 at the same time as each other. In operation S30 and S40, control logic may float word line by controlling at least one of read/write circuit and row decoder to be electrically isolated from the word line.

Memory device 100 according to an example embodiment may also precharge the first unselected word line when memory device 100 precharges the selected word line and may also float the first unselected word line when memory device 100 floats the selected word line. Memory device 100 may exhibit a coupling effect by a coupling capacitance between the selected word line and the first unselected word line, thereby preventing a voltage of the selected word line from increasing due to a first leakage current, and may compensate for an error due to the first leakage current, thereby improving the reliability of a read operation.

Figure 6A:
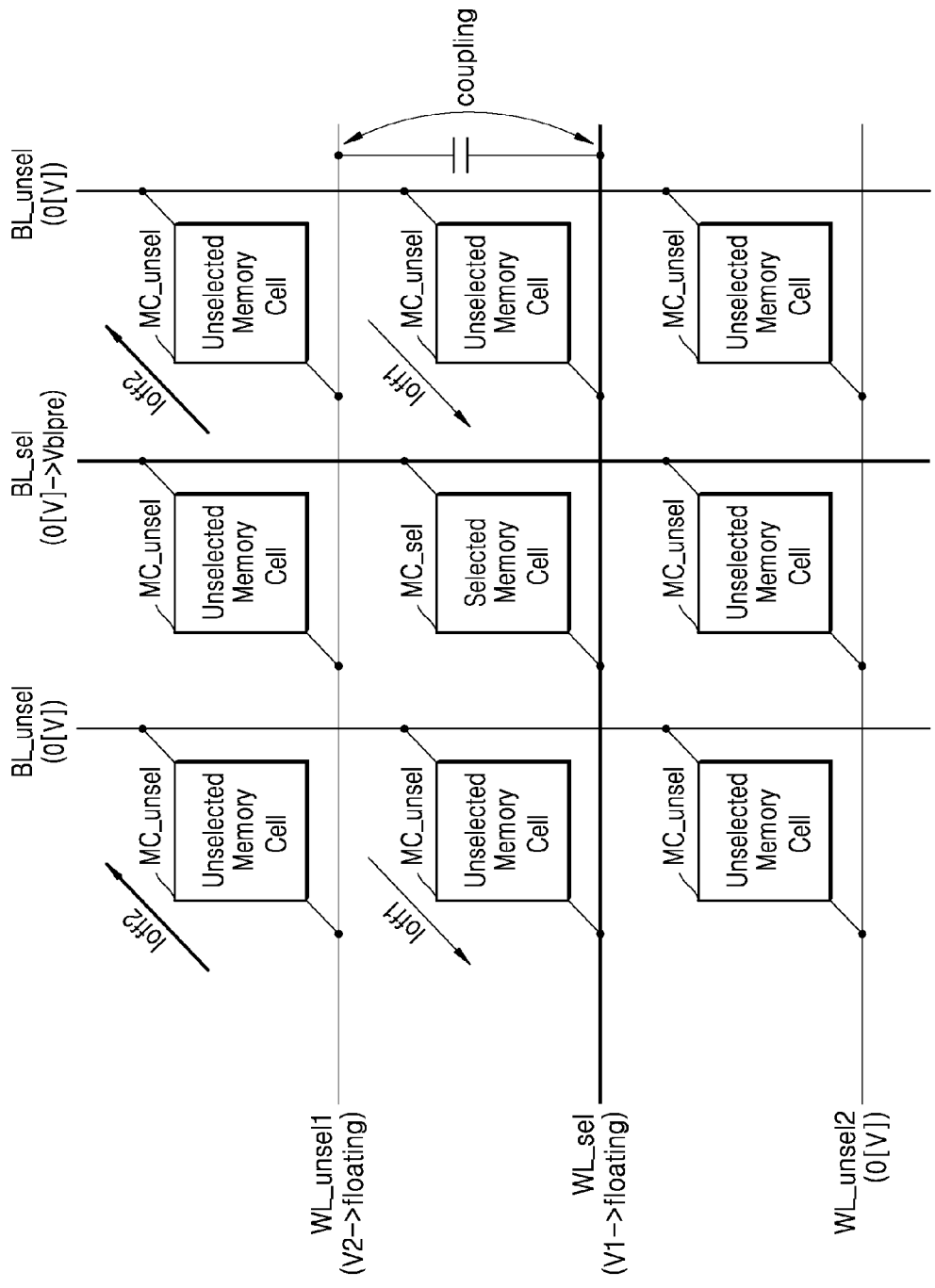
FIG. 6A is a circuit diagram for describing the read operation mode of an example embodiment of a memory device.
Figure 6B:
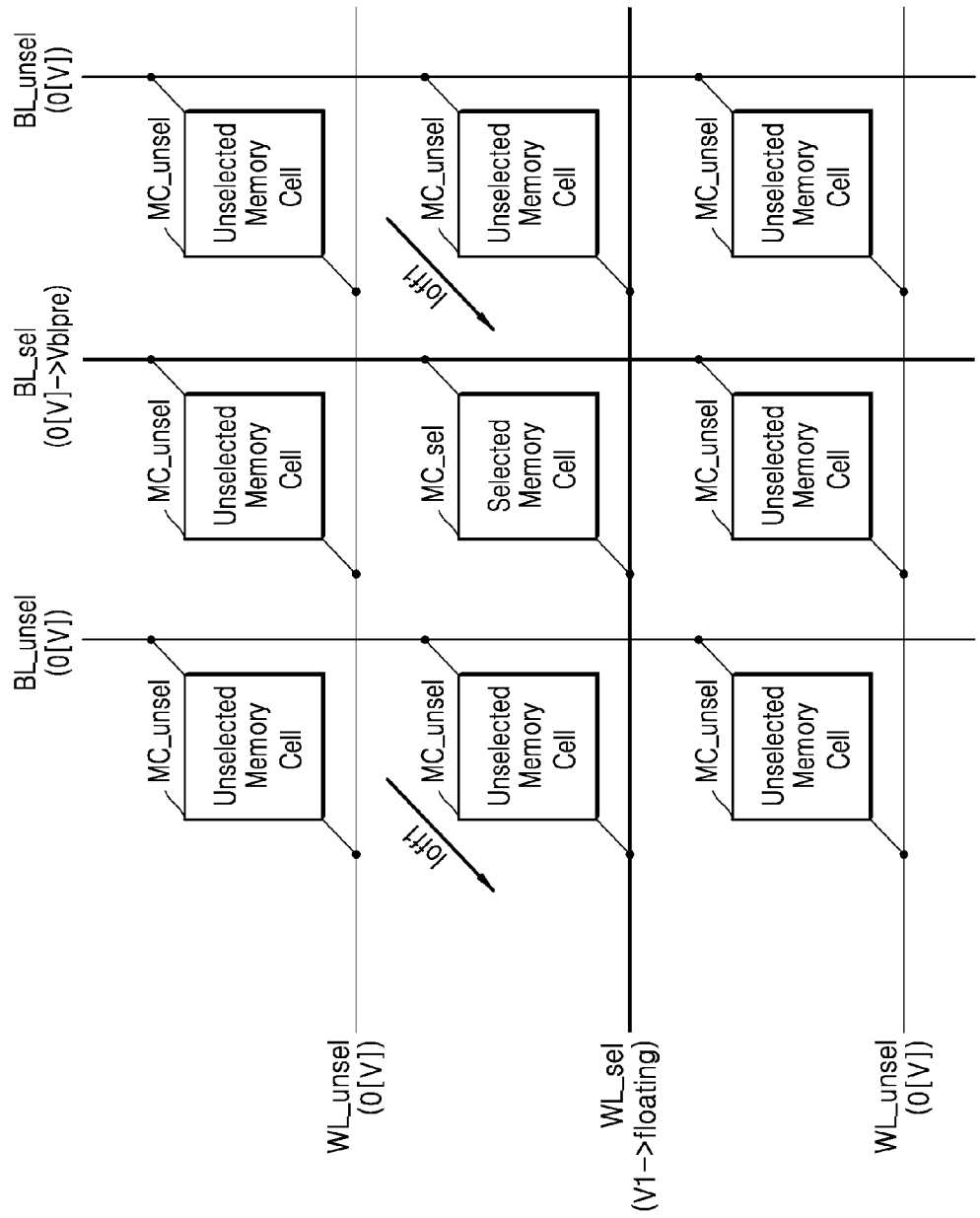
FIG. 6B is a circuit diagram for describing the read operation mode of a memory device according to a comparative example.
Figure 7:
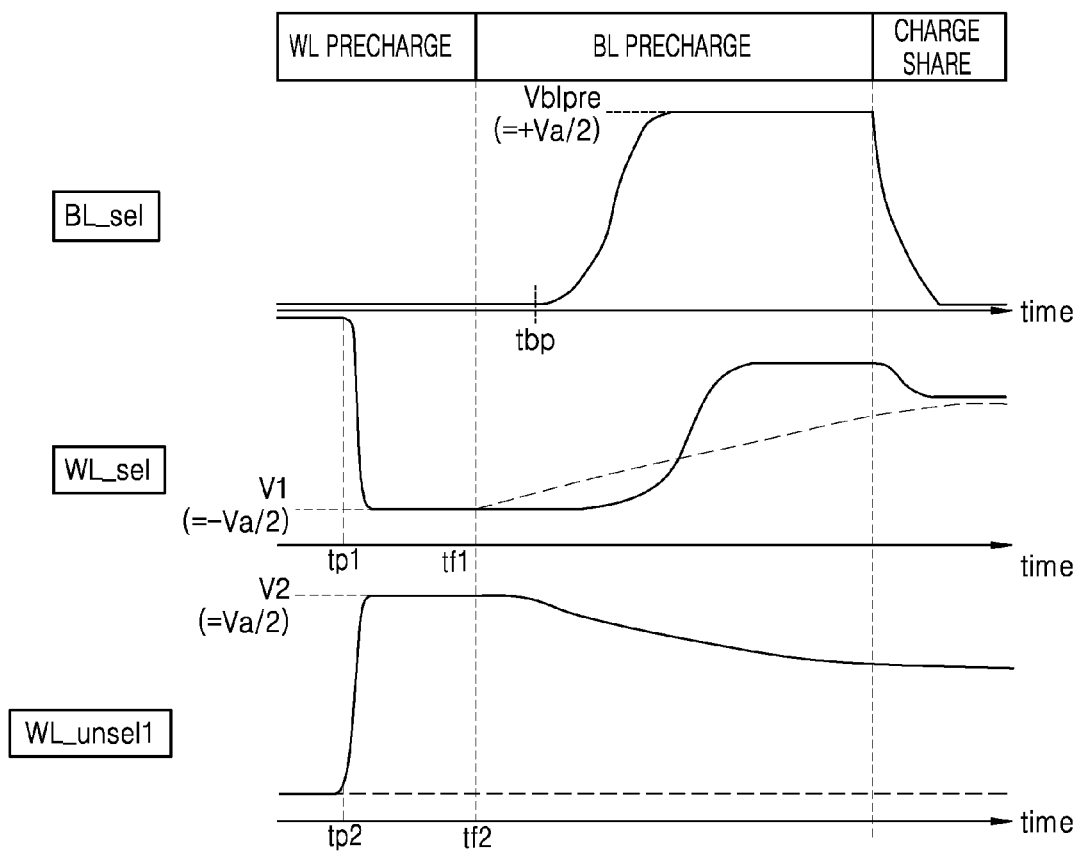
FIG. 7 shows voltage graphs in the read operation mode of an example embodiment of a memory device.

FIG. 6A is a circuit diagram for describing the read operation mode of an example embodiment of a memory device, and FIG. 6B is a circuit diagram for describing the read operation mode of a memory device according to a comparative example. FIG. 7 shows voltage graphs in the read operation mode of an example embodiment of a memory device. In FIG. 7, solid lines indicate voltage graphs in the read operation mode of FIG. 6A, and dashed lines indicate voltage graphs in the read operation mode of FIG. 6B. FIG. 7 shows voltage graphs when a selected memory cell is in the SET state. The read operation mode may include the word line precharge period, the bit line precharge period, and the charge share period.

Referring to FIGS. 6A and 7, in the word line precharge period, a memory device (e.g., memory device 100 of FIG. 1) may precharge, to a first voltage V1, a selected word line WL_sel connected to the selected memory cell MC_sel. In some embodiments, the first voltage V1 may be a negative voltage and may have a half magnitude of the read voltage Va.

In this case, in the word line precharge period, memory device 100 may precharge, to a second voltage V2, at least one first unselected word line WL_unsel1 among unselected word lines instead of the selected word line WL_sel. In some embodiments, the at least one first unselected word line WL_unsel1 may be one word line, and the first unselected word line WL_unsel1 may be adjacent to the selected word line WL_sel.

In some embodiments, the second voltage V2 may be a positive voltage and may have substantially the same magnitude as the first voltage V1. For example, the second voltage V2 may have a half of a magnitude of the read voltage Va.

Memory device 100 may precharge the selected word line WL_sel to the first voltage V1 at a first precharge time tp1 and precharge the first unselected word line WL_unsel1 to the second voltage V2 at a second precharge time tp2. In some embodiments, the first precharge time tp1 and the second precharge time tp2 may be substantially identical. That is, memory device 100 may precharge the selected word line WL_sel and the first unselected word line WL_unsel1 at the same time. However, embodiments are not limited thereto, and memory device 100 may precharge the selected word line WL_sel and the first unselected word line WL_unsel1 at different times.

In the word line precharge period, memory device 100 may control a second unselected word line WL_unsel2 instead of the first unselected word line WL_unsel1 among the unselected word lines such that the second unselected word line WL_unsel2 maintains a ground voltage level without being precharged. In addition, memory device 100 may control a plurality of bit lines (e.g., BL_sel and BL_unsel) such that the plurality of bit lines BL_sel and BL_unsel maintain the ground voltage level.

In the bit line precharge period, memory device 100 may float the selected word line WL_sel at a first floating time point tf1 and float the first unselected word line WL_unsel1 at a second floating time point tf2. In some embodiments, the first floating time point tf1 and the second floating time point tf2 may be substantially identical. That is, memory device 100 may float the selected word line WL_sel and the first unselected word line WL_unsel1 at the same time as each other. In this case, memory device 100 may control second unselected word lines WL_unsel2 such that the second unselected word lines WL_unsel2 maintain the ground voltage level.

At a precharge time point tbp in the bit line precharge period, the memory device 100 may precharge, to a bit line precharge voltage Vblpre, a selected bit line BL_sel connected to the selected memory cell MC_sel. For example, the bit line precharge voltage Vblpre may be a positive voltage and may have a half of a magnitude of the read voltage Va (i.e., Va/2). Memory device 100 may control unselected bit lines BL_unsel other than the selected bit line BL_sel such that the unselected bit lines BL_unsel maintain the ground voltage level.

At the precharge time point tbp, when the selected bit line BL_sel is precharged to thereby apply the read voltage Va to the selected memory cell MC_sel, a voltage graph of the selected word line WL_sel may exhibit different characteristics depending on whether a state of the selected memory cell MC_sel is in the SET state or the RESET state. For example, when the state of the selected memory cell MC_sel is the SET state, a relatively high current may flow through the selected memory cell MC_sel, such that a voltage of the selected word line WL_sel may significantly increase. For example, the voltage of the selected word line WL_sel may be greater than a reference voltage (e.g., Vref of FIG. 1).

Otherwise, unlike FIG. 7, when the state of the selected memory cell MC_sel is the RESET state, a relatively low current flows through the selected memory cell MC_sel, and thus a voltage level of the selected word line WL_sel may hardly change.

In the bit line precharge period, the read voltage Va may be applied to the selected memory cell MC_sel, and the first voltage V1, e.g., a voltage having a half value of the read voltage Va, may be applied to unselected memory cells MC_unsel connected to the selected word line WL_sel. Therefore, a first leakage current Ioff1 may flow through the unselected memory cells MC_unsel connected to the selected word line WL_sel.

In addition, in the bit line precharge period, the second voltage V2, e.g., a voltage having a half value of the read voltage Va, may be applied to unselected memory cells MC_unsel connected to the first unselected word line WL_unsel1 and the unselected bit lines BL_unsel. Therefore, a second leakage current Ioff2 may flow through the unselected memory cells MC_unsel connected to the first unselected word line WL_unsel1. The second leakage current Ioff2 may cause a voltage of the first unselected word line WL_unsel1 to decrease from the second voltage V2.

The occurrence of a coupling effect by a coupling capacitance between the selected word line WL_sel and the first unselected word line WL_unsel1 may prevent the voltage of the selected word line WL_sel from increasing due to the first leakage current Ioff1. Therefore, a prevention of an increase in the voltage of the selected word line WL_sel may prevent a decrease in a magnitude of a voltage substantially taken across both ends of the selected memory cell MC_sel.

In the charge share period, charges may be shared between the selected word line WL_sel and a sense amplifier (e.g., SA of FIG. 2) of a read/write circuit. The sense amplifier SA may sense a state of the selected memory cell MC_sel and read data by sensing a voltage of a sensing node (e.g., S0 of FIG. 2).

Referring to FIGS. 6B and 7, in the word line precharge period and the bit line precharge period, a ground voltage may be applied to unselected word lines WL_unsel other than the selected word line WL_sel.

In the bit line precharge period, the first voltage V1 may be applied across both ends of the unselected memory cells MC_unsel connected to the selected word line WL_sel. Therefore, the first leakage current Ioff1 flows through the unselected memory cells MC_unsel connected to the selected word line WL_sel, and the first leakage current Ioff1 flowing through each of the unselected memory cells MC_unsel causes a voltage of the selected word line WL_sel to increase.

In the bit line precharge period, the increase in the voltage of the selected word line WL_sel causes a magnitude of a voltage substantially taken across both ends of the selected memory cell MC_sel to decrease. The decrease in the voltage taken across both ends of the selected memory cell MC_sel may cause a sufficient current not to flow through the selected memory cell MC_sel. Therefore, the voltage of the selected word line WL_sel may decrease, and a voltage of the sensing node (e.g., sensing node S0 of FIG. 2) may also decrease, and thus, the memory device according to the comparative example may erroneously determine a memory cell which is in the SET state to be in the RESET state. That is, a read error may occur in the read operation mode by the memory device according to the comparative example.

Memory device 100 according to an example embodiment may prevent a voltage of the selected word line WL_sel from increasing due to the first leakage current Ioff1 by applying a certain magnitude of voltage to the first unselected word line WL_unsel1 and then floating the first unselected word line WL_unsel1. Therefore, memory device 100 may compensate for an error due to a leakage current in the selected word line, thereby ensuring a wide read window and improving the reliability of a read operation.

Figure 8:
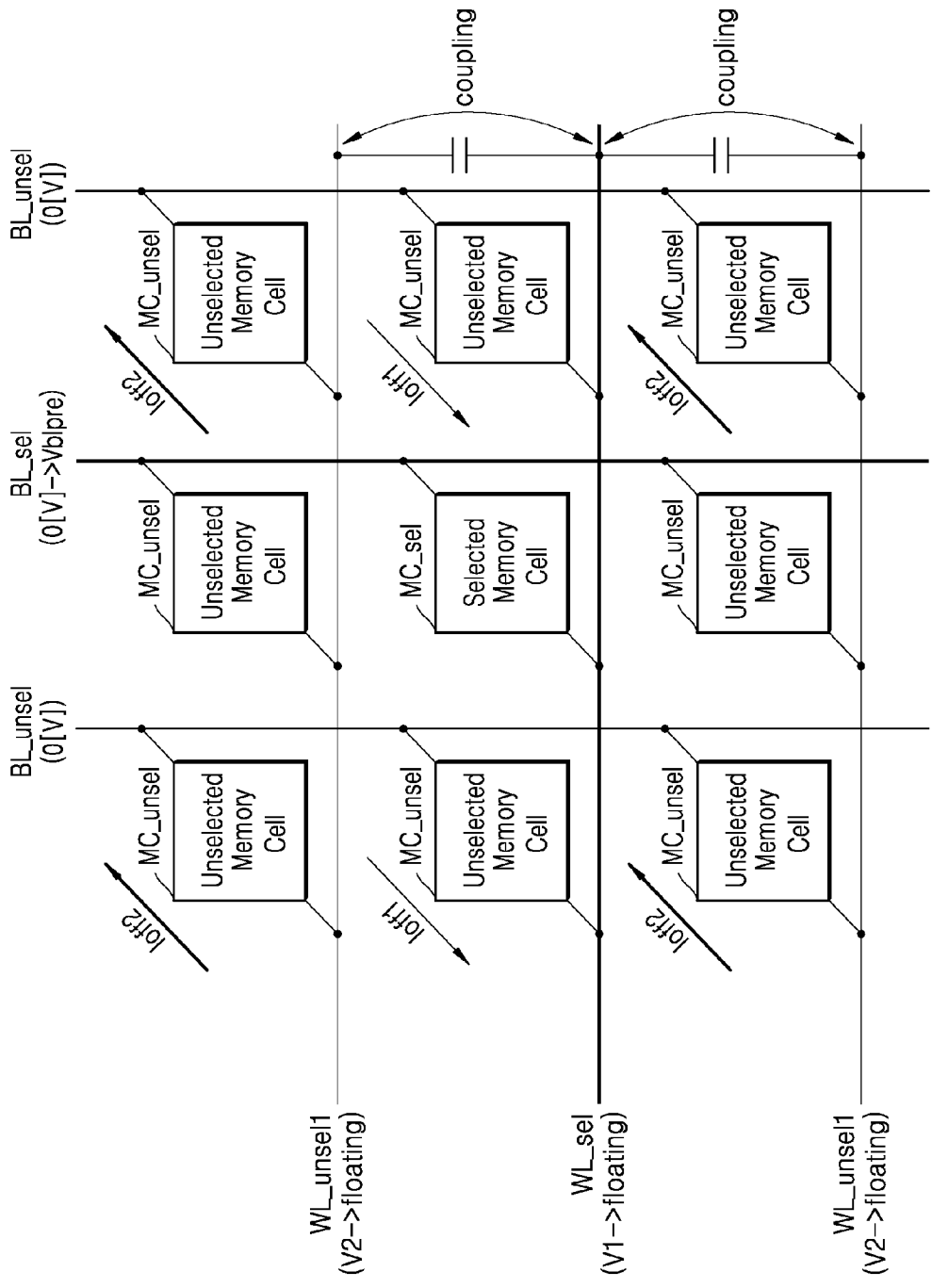
FIGS. 8 and 9 are circuit diagrams for describing the read operation mode of another example embodiment of a memory device.
Figure 9:
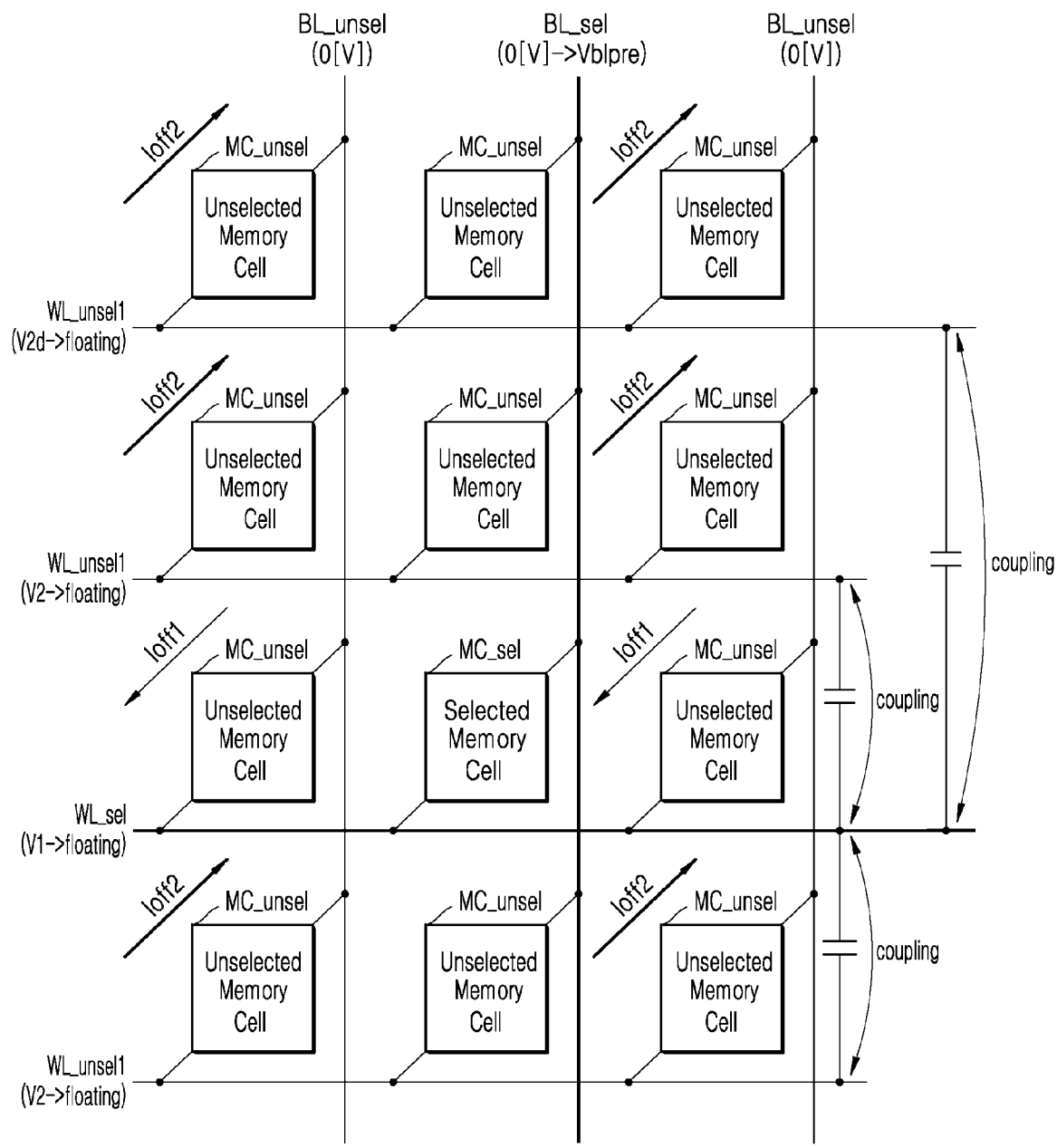

FIGS. 8 and 9 are circuit diagrams for describing the read operation mode of another example embodiment of a memory device. FIGS. 8 and 9 are circuit diagrams for describing a case of precharging a plurality of first unselected word lines. The same description as made with reference to FIG. 6A is not repeated in a description with reference to FIGS. 8 and 9.

Referring to FIG. 8, in the word line precharge period, the memory device (e.g., memory device 100 of FIG. 1) may precharge, to the second voltage V2, a plurality of first unselected word lines WL_unsel1 that are some of the unselected word lines. In some embodiments, the plurality of first unselected word lines WL_unsel1 may be two word lines adjacent to the selected word line WL_sel. For example, the select word line WL_sel may be the third word line WL2 of FIG. 2, and the first unselected word lines WL_unsel1 may be the second word line WL1 and a fourth word line WL3 of FIG. 2. In some embodiments, the second voltage V2 may be a positive voltage and may have substantially the same magnitude as that of the first voltage V1 that is a precharged voltage for the selected word line WL_sel (e.g., WL2 of FIG. 2). In some embodiments, the second voltage V2 may have a half value of a read voltage (e.g., Va of FIG. 4).

In some embodiments, memory device 100 may precharge each of the first unselected word lines WL_unsel1 to the second voltage V2 of a certain magnitude at the same time point. However, embodiments are not limited thereto, and the first unselected word lines WL_unsel1 may be precharged to the second voltage V2 at different time points, respectively.

In some embodiments, memory device 100 may simultaneously precharge the selected word line WL_sel and the first unselected word lines WL_unsel1. However, embodiments are not limited thereto, and a time when the selected word line WL_sel is precharged may differ from a time when each of the first unselected word lines WL_unsel1 is precharged.

In the bit line precharge period, memory device 100 may float the select word line WL_sel and float the plurality of first unselected word lines WL_unsel1. In some embodiments, memory device 100 may simultaneously float the selected word line WL_sel and the first unselected word lines WL_unsel1.

Referring to FIG. 9, in the word line precharge period, the memory device (e.g., memory device 100 of FIG. 1) may precharge, to the second voltage V2 or V2d, a plurality of first unselected word lines WL_unsel1 among unselected word lines. In some embodiments, the plurality of first unselected word lines WL_unsel1 may include word lines which are not adjacent to the selected word line WL_sel. Although FIG. 9 shows only a case where the plurality of first unselected word lines WL_unsel1 are precharged, one first unselected word line WL_unsel1, which is not adjacent to the selected word line WL_sel, may be precharged together with the selected word line WL_sel.

In some embodiments, a magnitude of the second voltage V2 or V2d to be applied to each of the plurality of first unselected word lines WL_unsel1 may vary depending on a distance from the selected word line WL_sel. For example, a magnitude of the second voltage V2 or V2d to be applied to each of the plurality of first unselected word lines WL_unsel1 may be larger as a distance from the selected word line WL_sel is larger. For example, the selected word line WL_sel may be the third word line WL2 of FIG. 2, and the plurality of first unselected word lines WL_unsel1 may include the first word line WL0, the second word line WL1 and the fourth word line WL3 of FIG. 2. The second voltage V2d to which the first word line WL0 is precharged may be greater than the second voltage V2 to which the second word line WL1 is precharged. However, embodiments are not limited thereto, and magnitudes of the second voltages V2 and V2d to be applied to the plurality of first unselected word lines WL_unsel1 may be identical to each other.

Referring to FIGS. 8 and 9, memory device 100 may exhibit a coupling effect between the selected word line WL_sel and the first unselected word lines WL_unsel1 by causing the second leakage current Ioff2 to flow through each of unselected memory cells MC_unsel connected to the first unselected word lines WL_unsel1 and unselected bit lines BL_unsel. Therefore, memory device 100 may prevent a voltage of the selected word line WL_sel from increasing due to the first leakage current Ioff1. Memory device 100 may compensate for an error due to a leakage current, thereby improving the reliability of a read operation.

Figure 10A:
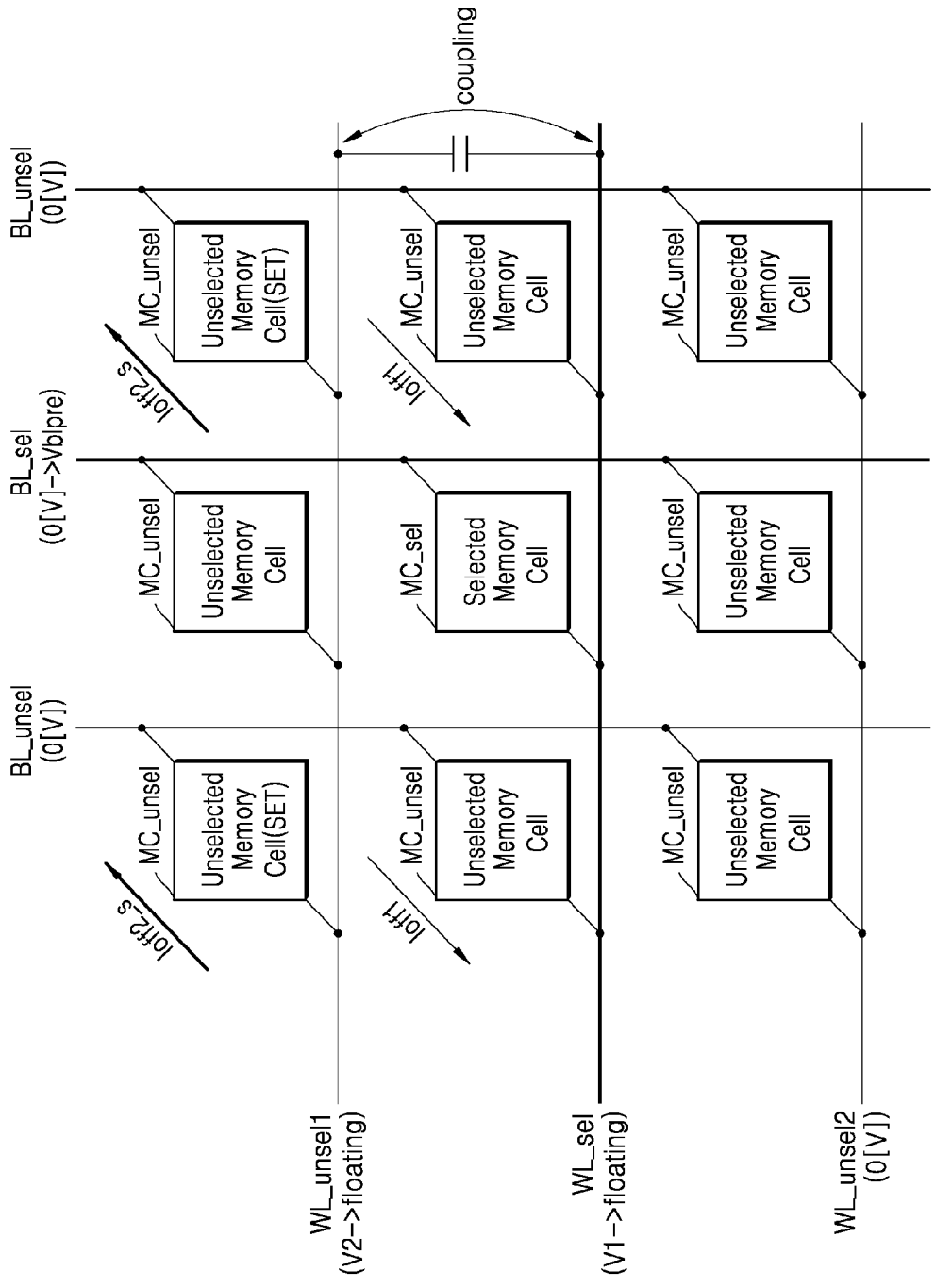
FIGS. 10A and 10B are circuit diagrams for describing the read operation mode of another example embodiment of a memory device.
Figure 10B:
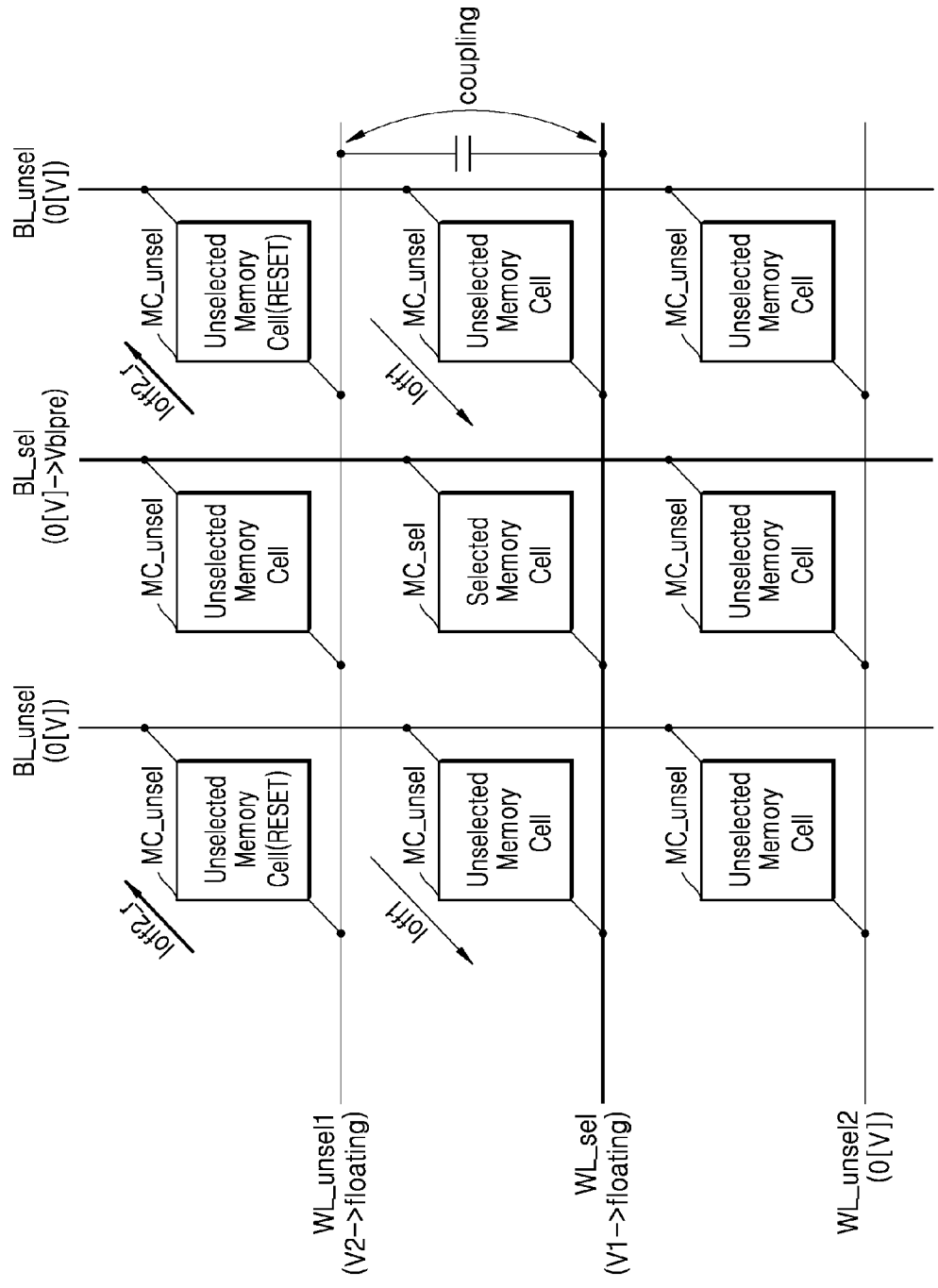

FIGS. 10A and 10B are circuit diagrams for describing the read operation mode of another example embodiment of a memory device. FIGS. 10A and 10B are circuit diagrams for describing an operation of precharging a first unselected word line according to a state of unselected memory cells. The same description as made with reference to FIG. 6A is not repeated in a description with reference to FIGS. 10A and 10B.

Referring to FIGS. 10A and 10B, in the word line precharge period, the memory device (e.g., memory device 100 of FIG. 1) may precharge, to the second voltage V2, at least one first unselected word line WL_unsel1 among unselected word lines. For example, the at least one first unselected word line WL_unsel1 may be adjacent to the selected word line WL_sel.

As shown in FIG. 10A, when unselected memory cells MC_unsel connected to the first unselected word line WL_unsel1 are in the SET state, a set leakage current Ioff2_s may flow through each of the unselected memory cells MC_unsel. Otherwise, as shown in FIG. 10B, when the unselected memory cells MC_unsel connected to the first unselected word line WL_unsel1 are in the RESET state, a reset leakage current Ioff2_r may flow through each of the unselected memory cells MC_unsel. As shown in FIG. 4, when the same voltage is applied to memory cells, a magnitude of the reset leakage current Ioff2_r is less than a magnitude of the set leakage current Ioff2_s, and thus, a decrease level of a voltage of the first unselected word line WL_unsel1 may vary according to a state of the unselected memory cells MC_unsel connected to the first unselected word line WL_unsel1.

In some embodiments, memory device 100 may determine a magnitude of the second voltage V2 according to a program state of the unselected memory cells MC_unsel connected to the first unselected word line WL_unsel1. For example, memory device 100 may adjust the magnitude of the second voltage V2 such that the magnitude of the second voltage V2 is larger as the number of memory cells in the RESET state is larger among the unselected memory cells MC_unsel connected to the first unselected word line WL_unsel1.

Memory device 100 may compensate such that a magnitude of a second leakage current (e.g., Ioff2_s or Ioff2_r) varies according to a state of the unselected memory cells MC_unsel connected to the first unselected word line WL_unsel1. That is, the memory device 100 may adjust a magnitude of the second voltage V2 such that a coupling effect between the selected word line WL_sel and the first unselected word line WL_unsel1 is maintained constant, thereby preventing the coupling effect with the selected word line WL_sel from decreasing or excessively occurring.

Figure 11:
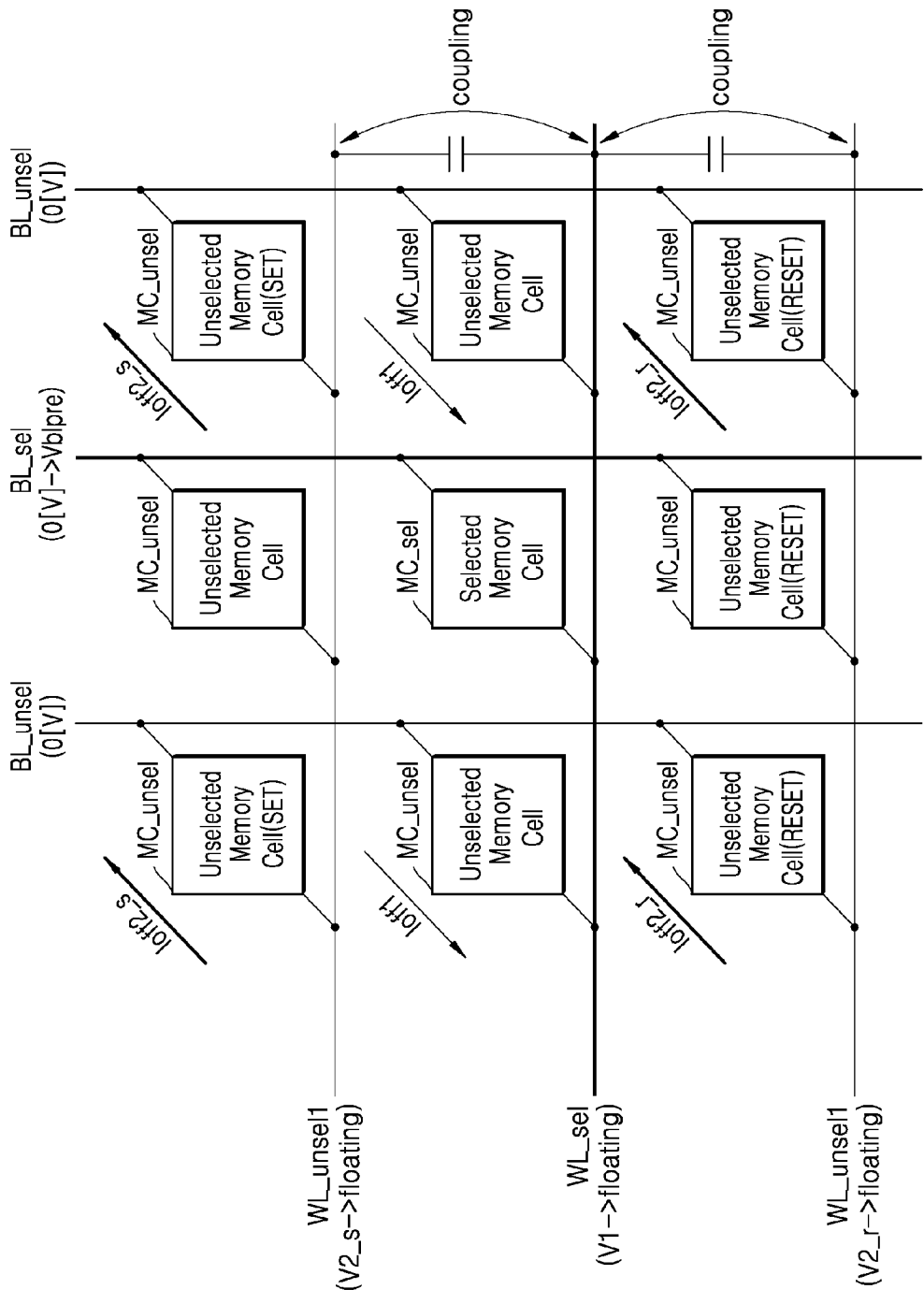
FIG. 11 is a circuit diagram for describing the read operation mode of another example embodiment of a memory device.

FIG. 11 is a circuit diagram for describing the read operation mode of another example embodiment of a memory device. FIG. 11 is a circuit diagram for describing an operation of determining a magnitude of a second voltage to which first unselect word lines are precharged. The same description as made with reference to FIG. 6A is not repeated in a description with reference to FIG. 11.

Referring to FIG. 11, in the word line precharge period, the memory device (e.g., memory device 100 of FIG. 1) may precharge a plurality of first unselected word lines WL_unsel1 that are some of the unselected word lines. In some embodiments, the plurality of first unselected word lines WL_unsel1 may be adjacent to the selected word line WL_sel.

In some embodiments, a voltage to which the plurality of first unselected word lines WL_unsel1 are precharged may vary according to a state of unselected memory cells MC_unsel connected to the first unselected word lines WL_unsel1. That is, voltages to be respectively applied to the first unselected word lines WL_unsel1 may be different from each other.

In some embodiments, a magnitude of a voltage to be applied to each of the first unselected word lines WL_unsel1 may be larger as the number of memory cells in the RESET state among unselected memory cells MC_unsel connected to each of the first unselected word lines WL_unsel1 is larger. For example, when unselected memory cells MC_unsel connected to one of the first unselected word lines WL_unsel1 are in the SET state, memory device 100 may precharge the one first unselected word line WL_unsel1 to a second set voltage V2_s in the word line precharge period. Otherwise, when unselected memory cells MC_unsel connected to one of the first unselected word lines WL_unsel1 are in the RESET state, memory device 100 may precharge the one first unselected word line WL_unsel1 to a second reset voltage V2_r in the word line precharge period. A magnitude of the second reset voltage V2_r may be greater than a magnitude of the second set voltage V2_s.

When the same voltage is applied to memory cells, a magnitude of the reset leakage current Ioff2_r flowing through reset memory cells may be less than a magnitude of the set leakage current Ioff2_s flowing through set memory cells. Therefore, memory device 100 may determine a magnitude of a voltage to be applied to each of the first unselected word lines WL_unsel1 according to a program state of unselected memory cells MC_unsel connected to each of the first unselected word lines WL_unsel1, thereby preventing a change in a coupling effect provided to the selected word line WL_sel for each of the first unselected word lines WL_unsel1.

Figure 12A:
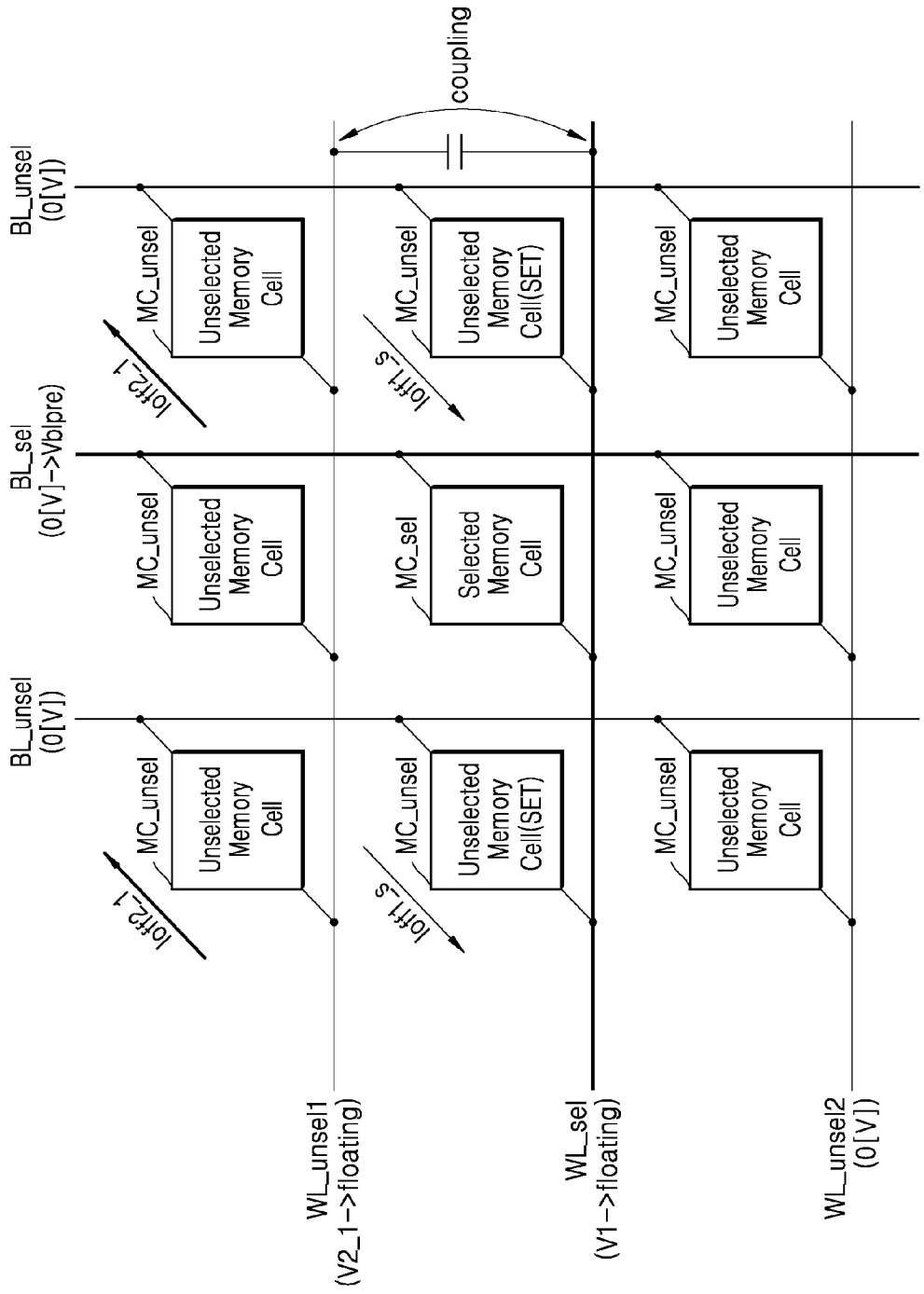
FIGS. 12A and 12B are circuit diagrams for describing the read operation mode of another example embodiment of a memory device.
Figure 12B:
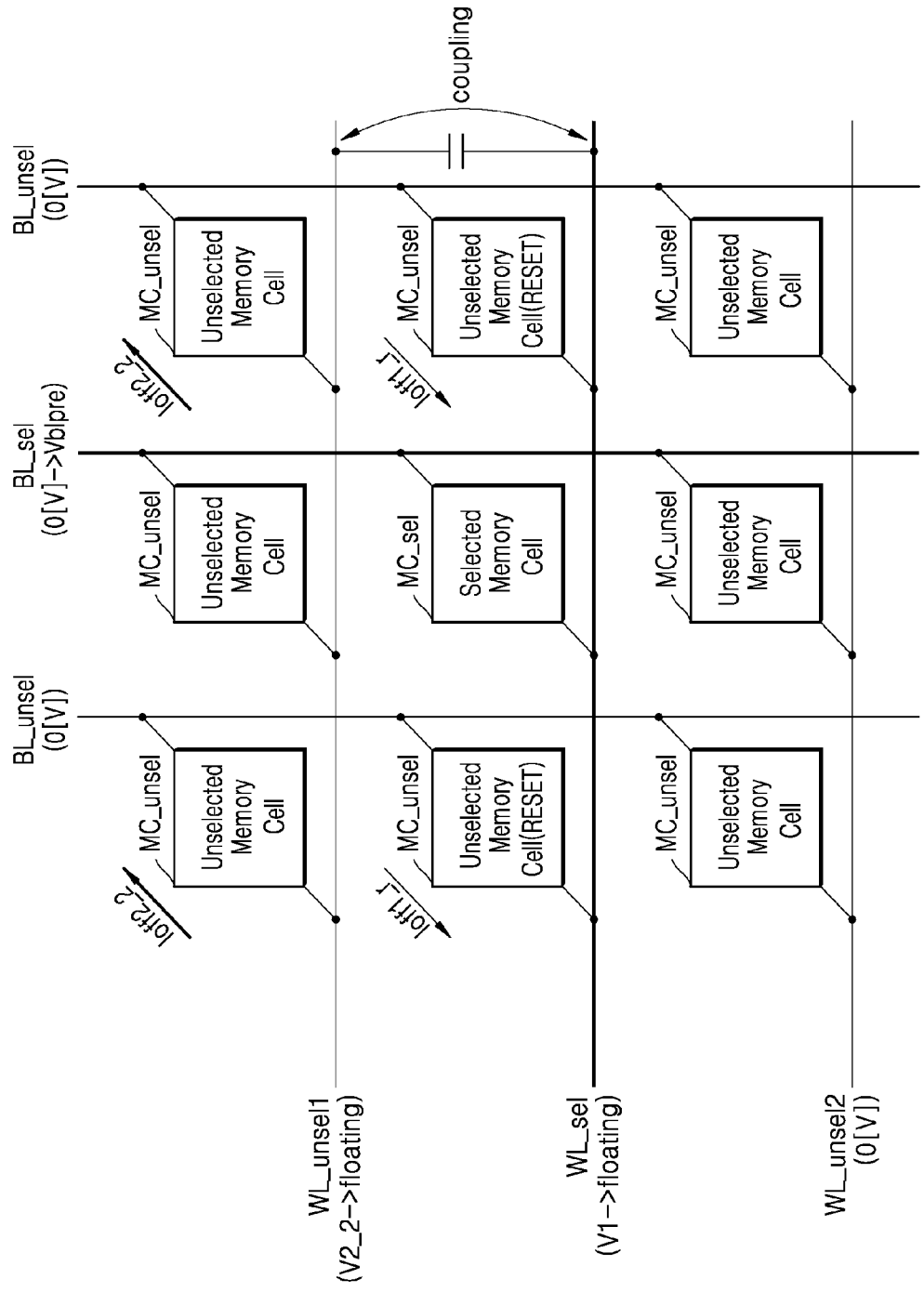

FIGS. 12A and 12B are circuit diagrams for describing the read operation mode of another example embodiment of a memory device. FIGS. 12A and 12B are circuit diagrams for describing an operation of precharging a first unselected word line according to a state of unselected memory cells. The same description as made with reference to FIG. 6A is not repeated in a description with reference to FIGS. 12A and 12B.

Referring to FIGS. 12A and 12B, in the word line precharge period, the memory device (e.g., memory device 100 of FIG. 1) may precharge, to a second voltage V2_1 or V2_2, at least one first unselected word line WL_unsel1 among unselected word lines. For example, the at least one first unselected word line WL_unsel1 may include a word line adjacent to the selected word line WL_sel.

As shown in FIG. 12A, when unselected memory cells MC_unsel connected to the selected word line WL_sel are in the SET state, a set leakage current Ioff1_s may flow through each of the unselected memory cells MC_unsel. The set leakage current Ioff1_s may be the set leakage current Ioff_set of FIG. 4. Otherwise, as shown in FIG. 12B, when the unselected memory cells MC_unsel connected to the selected word line WL_sel are in the RESET state, a reset leakage current Ioff1_r may flow through each of the unselected memory cells MC_unsel. The reset leakage current Ioff1_r may be the reset leakage current Ioff_reset of FIG. 4. A magnitude of the reset leakage current Ioff1_r is less than a magnitude of the set leakage current Ioff1_s, and thus, an increase level of a voltage of the selected word line WL_sel may vary according to a state of the unselected memory cells MC_unsel connected to the selected word line WL_sel.

In some embodiments, memory device 100 may determine a magnitude of the second voltage V2_1 or V2_2 according to a program state of the unselected memory cells MC_unsel connected to the selected word line WL_sel. For example, memory device 100 may adjust the magnitude of the second voltage V2_1 or V2_2 such that the magnitude of the second voltage V2_1 or V2_2 is smaller as the number of memory cells in the RESET state is larger among the unselected memory cells MC_unsel connected to the selected word line WL_sel. For example, a magnitude of the second voltage V2_1 to be applied to the first unselected word line WL_unsel1 when the unselected memory cells MC_unsel connected to the selected word line WL_sel are in the SET state may be greater than a magnitude of the second voltage V2_2 to be applied to the first unselected word line WL_unsel1 when the unselected memory cells MC_unsel connected to the selected word line WL_sel are in the RESET state.

Memory device 100 may compensate such that according to a state of the unselected memory cells MC_unsel connected to the selected word line WL_sel, a magnitude of a first leakage current (e.g., Ioff1_s or Ioff1_r) flowing through the unselected memory cells MC_unsel varies, and an increase level of a voltage of the selected word line WL_sel varies. That is, memory device 100 may adjust a magnitude of the second voltage V2_1 or V2_2 such that a coupling effect between the selected word line WL_sel and the first unselected word line WL_unsel1 does not decrease or excessively occur.

Figure 13:
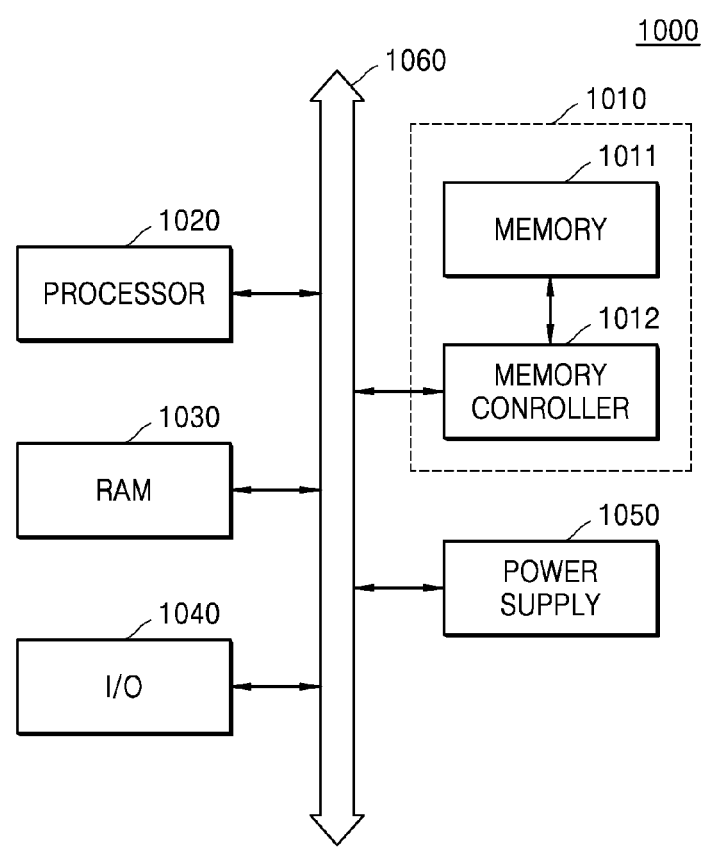
FIG. 13 is a block diagram of a computing system including an example embodiment of a memory device.

FIG. 13 is a block diagram of a computing system 1000 including an example embodiment of a memory device.

Referring to FIG. 13, computing system 1000 may include a memory system 1010, a processor 1020, RAM 1030, an input and output device 1040, and a power supply device 1050. Although not shown in FIG. 13, computing system 1000 may further include ports capable of communicating with a video card, a sound card, a memory card, a universal serial bus (USB) device, and the like or other electronic devices. Computing system 1000 may be implemented by a personal computer or a portable electronic device such as a laptop computer, a cellular phone, a personal digital assistant (PDA), or a camera.

Processor 1020 may perform certain computations or tasks. In some embodiments, processor 1020 may be a microprocessor or a central processing unit (CPU). Processor 1020 may communicate with RAM 1030, input and output (I/O) device 1040, and memory system 1010 via a bus 1060 such as an address bus, a control bus, and a data bus.

Memory system 1010 may include a nonvolatile memory device 1011 and a memory controller 1012. Nonvolatile memory device 1011 may be implemented by using the embodiments described above with reference to FIGS. 1 to 12B.

Nonvolatile memory device 1011 may be a resistive memory device including memory cells arranged at points of intersection between a plurality of word lines and a plurality of bit lines and having a resistance level varying according to stored data.

Nonvolatile memory device 1011 may precharge an unselected word line to a second voltage when precharging a selected word line connected to a selected memory cell to a first voltage. Accordingly, nonvolatile memory device 1011 may compensate for an error due to a leakage current, thereby improving the reliability of a read operation by reducing a read error.

Processor 1020 may also be connected to an extension bus such as a peripheral component interconnect (PCI) bus. RAM 1030 may store data necessary for an operation of computing system 1000. For example, RAM 1030 may be implemented by dynamic RAM (DRAM), static RAM (SRAM), PRAM, ferroelectric RAM (FRAM), RRAM, and/or MRAM. Input and output device 1040 may include an input means such as a keyboard, a keypad, and a mouse and an output means such as a printer and a display. Power supply device 1050 may supply power necessary for an operation of computing system 1000.

The various operations of methods described above may be performed by any suitable means capable of performing the operations, such as various hardware and/or software component(s), circuits, and/or module(s). The software may comprise an ordered listing of executable instructions for implementing logical functions, and can be embodied in any "processor-readable medium" for use by or in connection with an instruction execution system, apparatus, or device, such as a single or multiple-core processor or processor-containing system. The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

As described above, example embodiments are disclosed with reference to the drawings and the description. Although particular terms are used to describe the embodiments in the specification, these terms are used to describe the technical idea of the inventive concept but are not used to limit the meaning or limit the scope of the inventive concept in the claims. While the inventive concept has been particularly shown and described with reference to embodiments thereof, it will be understood that various changes in form and details may be made therein without departing from the spirit and scope of the claims.

What is claimed is:

1. A memory device, comprising:
a memory cell array comprising a plurality of memory cells respectively arranged at points at which word lines cross bit lines; and
a control logic circuit configured to precharge a selected word line from among the word lines that is connected to a selected memory cell from among the plurality of memory cells and to precharge a selected bit line from among the bit lines that is connected to the selected memory cell in a read operation,
wherein the control logic circuit is further configured to precharge a first unselected word line among a plurality of unselected word lines from among the word lines to a second voltage when the selected word line is precharged to a first voltage,
wherein a level of the first voltage is lower than a level of a third voltage applied to an unselected bit line from among the bit lines when the selected word line is precharged to the first voltage, and a level of the second voltage is higher than the level of the third voltage, and
wherein the control logic circuit is further configured to determine a magnitude of the second voltage based on a distance from the selected word line to the first unselected word line.

2. The memory device of claim 1, wherein the first unselected word line is adjacent to the selected word line.

3. The memory device of claim 1, wherein the control logic circuit is further configured to precharge the selected bit line after floating the first unselected word line from the second voltage.

4. The memory device of claim 1, wherein the control logic circuit is further configured to match a first precharge time point at which the first voltage is provided to the selected word line with a second precharge time point at which the second voltage is provided to the first unselected word line.

5. The memory device of claim 1, wherein the control logic circuit is further configured to determine a magnitude of the second voltage according to program states of memory cells connected to the first unselected word line.

6. The memory device of claim 1, wherein the control logic circuit is further configured to determine a magnitude of the second voltage according to program states of unselected memory cells connected to the selected word line.

7. A memory device, comprising:
a memory cell array comprising a plurality of memory cells respectively arranged at points at which word lines cross bit lines; and
a control logic circuit configured to control voltages to be provided to the word lines,
wherein the control logic circuit is further configured to provide a second voltage from among the voltages to one or more first unselected word lines among a plurality of unselected word lines from the word lines when a first voltage from among the voltages is provided to a selected word line from among the word lines that is connected to a selected memory cell among the plurality of memory cells, and to float the one or more first unselected word lines when the selected word line is floated,
wherein a level of the first voltage is lower than a level of a third voltage from among the voltages that is provided to an unselected bit line from among the bit lines when the first voltage is provided to the selected word line, and a level of the second voltage is higher than the level of the third voltage, and
wherein the control logic is further configured to adjust a magnitude of the second voltage according to program states of unselected memory cells from among the plurality of memory cells.

8. The memory device of claim 7, wherein the one or more first unselected word lines comprise a word line adjacent to the selected word line.

9. The memory device of claim 7, wherein the control logic circuit is further configured to float the selected word line from the first voltage at a first floating time point, to float the one or more first unselected word lines from the second voltage at a second floating time point, and to match the first floating time point with the second floating time point.

10. The memory device of claim 7, wherein the control logic circuit is further configured to match a first precharge time point at which the first voltage is provided to the selected word line with a second precharge time point at which the second voltage is provided to the one or more first unselected word lines.

11. The memory device of claim 7, wherein the control logic circuit is further configured to adjust the magnitude of the second voltage according to the program states of unselected memory cells connected to the one or more first unselected word lines.

12. The memory device of claim 7, wherein the control logic circuit is further configured to adjust the magnitude of the second voltage according to the program states of unselected memory cells connected to the selected word line.

13. The memory device of claim 7, wherein the control logic circuit is further configured to provide the second voltage to each of a plurality of first unselected word lines among the one or more first unselected word lines, and
wherein magnitudes of the second voltage respectively provided to the plurality of first unselected word lines differ from each other.

14. An operating method of a memory device comprising a plurality of memory cells respectively arranged at regions at which word lines cross bit lines, the operating method comprising:

precharging, to a first voltage, a selected word line from among the word lines that is connected to a selected memory cell among the plurality of memory cells to apply a selected cell voltage between both ends of the selected memory cell;

precharging, to a second voltage, a first unselected word line from among the word lines that is connected to a first unselected memory cell among the plurality of memory cells to apply an unselected cell voltage between ends of the first unselected memory cell;

floating the selected word line from the first voltage; and floating the first unselected word line from the second voltage, wherein the precharging of the selected word line and the precharging of the first unselected word line are performed in parallel to each other, wherein a level of the first voltage is lower than a level of a third voltage applied to an unselected bit line from the bit lines when the selected word line is precharged to the first voltage, and a level of the second voltage is higher than the level of the third voltage, and wherein a polarity of the first voltage with respect to ground is opposite a polarity of the second voltage with respect to ground.

15. The operating method of claim 14, wherein the first unselected word line comprises a word line from the word lines that is adjacent to the selected word line.

16. The operating method of claim 14, wherein a magnitude of the second voltage equals a magnitude of the first voltage.

* * * * *